(12) United States Patent
Ruhl et al.

(10) Patent No.: US 6,300,812 B1
(45) Date of Patent: Oct. 9, 2001

(54) PROCESS, VOLTAGE, AND TEMPERATURE INSENSITIVE TWO PHASE CLOCK GENERATION CIRCUIT

(75) Inventors: Gregory E. Ruhl, Portland; Siva G. Narendra; Vivek K. De, both of Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/672,340

(22) Filed: Sep. 28, 2000

(51) Int. Cl.[7] .................................................. G01R 25/00
(52) U.S. Cl. ........................................... 327/258; 327/295
(58) Field of Search ............................... 327/2, 239, 240, 327/257, 258, 259, 163, 378, 401, 403, 512, 295, 296; 326/96

(56) References Cited

U.S. PATENT DOCUMENTS 5,047,659 * 9/1991 Ullrich .................................. 327/259
5,623,222 * 4/1997 Tamagawa ............................ 327/259
5,646,557 * 7/1997 Runyon et al. ......................... 326/97
6,008,685 * 12/1999 Kunst .................................... 327/512

* cited by examiner

Primary Examiner—My-Trang Nu Ton
(74) Attorney, Agent, or Firm—Schwegman, Lundberg, Woessner & Kluth, P.A.

(57) ABSTRACT

A two phase clock generation circuit uses a current mirror and a crossbar switch to generate true and complement output clock signals that are relatively insensitive to process, voltage, and temperature variations. The current mirror generates a charging current and a discharging current that have a fixed magnitude ratio. The crossbar switch then alternately couples the charging current and the discharging current to the true and complement outputs of the clock generation circuit to generate the output clock signals. A selection signal generation unit is provided for generating the selection signal(s) required to appropriately control the switch. Because the charging and discharging currents are at fixed magnitudes and the crossbar switch is a balanced structure, the output clock signals remain aligned to a high degree of accuracy over a wide variety of conditions.

20 Claims, 5 Drawing Sheets

US 6,300,812 B1

PROCESS, VOLTAGE, AND TEMPERATURE INSENSITIVE TWO PHASE CLOCK GENERATION CIRCUIT

FIELD OF THE INVENTION

The invention relates generally to clock circuits and, more particularly, to two phase clock circuits that generate both true and complement clock waveforms.

BACKGROUND OF THE INVENTION

A two phase clock generation circuit is a device that generates both true and complement clock signals at an output thereof. Such devices are used today in a variety of complementary metal oxide semiconductor (CMOS) based designs. Ideally, the rising edge of the true clock signal will align in time with the falling edge of the complement clock signal, and vice versa. However, in past two phase clock designs, the alignment between the two clock signals is optimal for only a predetermined set of ideal conditions. If these conditions are varied, undesired phase offsets begin to occur between the true and complement clock signals that reduce the overall effectiveness and quality of the signals. For example, variations in process, operating voltage, and operating temperature can introduce significant offsets between the true and complement clock signals that can compromise system performance. With chip speeds continually rising, it is becoming increasingly important that phase offsets between the true and complement clock signals be kept to a minimum for a wide range of possible process and operating conditions.

Therefore, there is need for a two phase clock generation circuit that is less sensitive to variations in process and operating conditions.

DETAILED DESCRIPTION

The present invention relates to a two phase clock generation circuit that is relatively insensitive to process variations and changes in circuit operating conditions (e.g., voltage and temperature). The circuit utilizes a dual current source that is coupled to a crossbar switch for generating the true and complement clock signals. The current source generates a charging current at one output node and a discharging current at another output node. The charging and discharging currents maintain a fixed magnitude ratio under a wide range of operating conditions (including variations in process skew, voltage, and temperature). In response to one or more selection signals, the crossbar switch alternately couples the charging and discharging currents between two output clock terminals to generate the true and complement clock signals. Because the charging and discharging currents are at fixed magnitudes and the crossbar switch is a balanced structure, the output clock signals remain aligned to a high degree of accuracy over a wide variety of conditions. Using the inventive principles, reductions in the mean offset between true and complement clock signals of up to 70% have been achieved.

Figure 1:
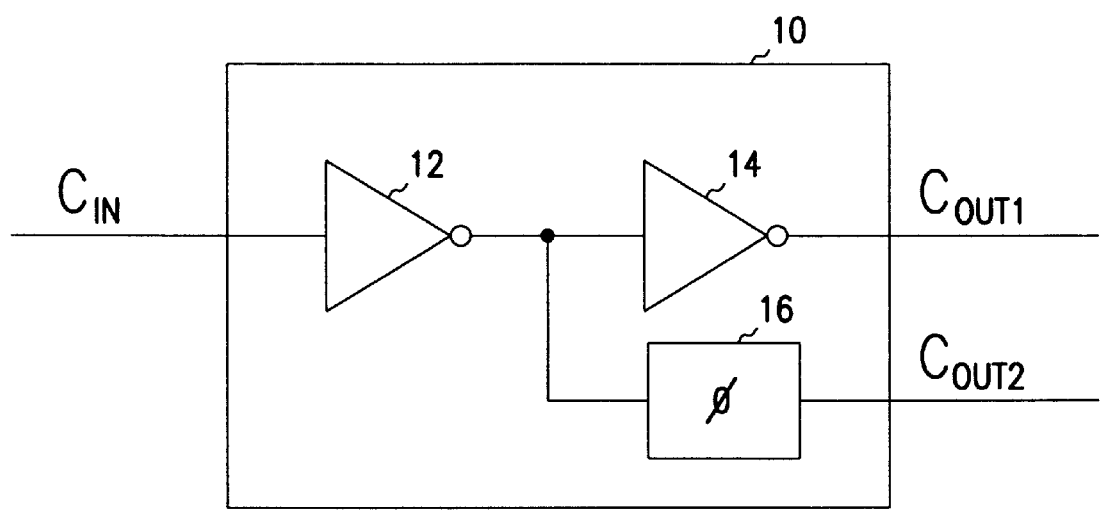
FIG. 1 is a schematic diagram illustrating a conventional two phase clock generation circuit.

FIG. 1 is a schematic diagram illustrating a conventional two phase clock generation circuit 10 including first and second inverters 12, 14 and a delay unit 16. The first inverter 12 receives a single-ended clock input signal $C_{in}$ at an input and inverts the signal. The inverted clock signal is then delivered to the inputs of both the second inverter 14 and the delay unit 16. The second inverter 14 inverts the inverted clock signal again to achieve a first clock output signal $c_{out1}$. At the same time, the delay unit 16 delays the inverted clock signal by a delay amount that is equal to the inversion delay of the second inverter 14 to generate a second clock output signal $c_{out2}$. If the circuit elements are properly matched and the operating conditions are within an appropriate range, the first and second clock output signals ($co_{out1}$ and $c_{out2}$) will be complements of one another with the rising edge of the first signal aligning in time with the falling edge of the second signal and the falling edge of the first signal aligning in time with the rising edge of the second signal. However, process variations that occur during clock circuit manufacture can create a condition where the elements of the clock generation circuit 10 are not properly matched, resulting in a time offset between the output clock signals. In addition, variations in circuit operating conditions, such as temperature and voltage, can also lead to a time offset between the output clock signals. For example, an increase in operating temperature can change the delay of the second inverter 14 by a different amount than the delay of the delay unit 16. Because process variations and variations in operating conditions are inevitable, two phase clock designs using the architecture of FIG. 1 can be expected to generate a relatively high mean offset between output clock signals. With processor speeds continually rising, it is becoming increasingly important that these clock offsets be minimized and that clock circuits be made less sensitive to process and operating condition variations.

Figure 2:
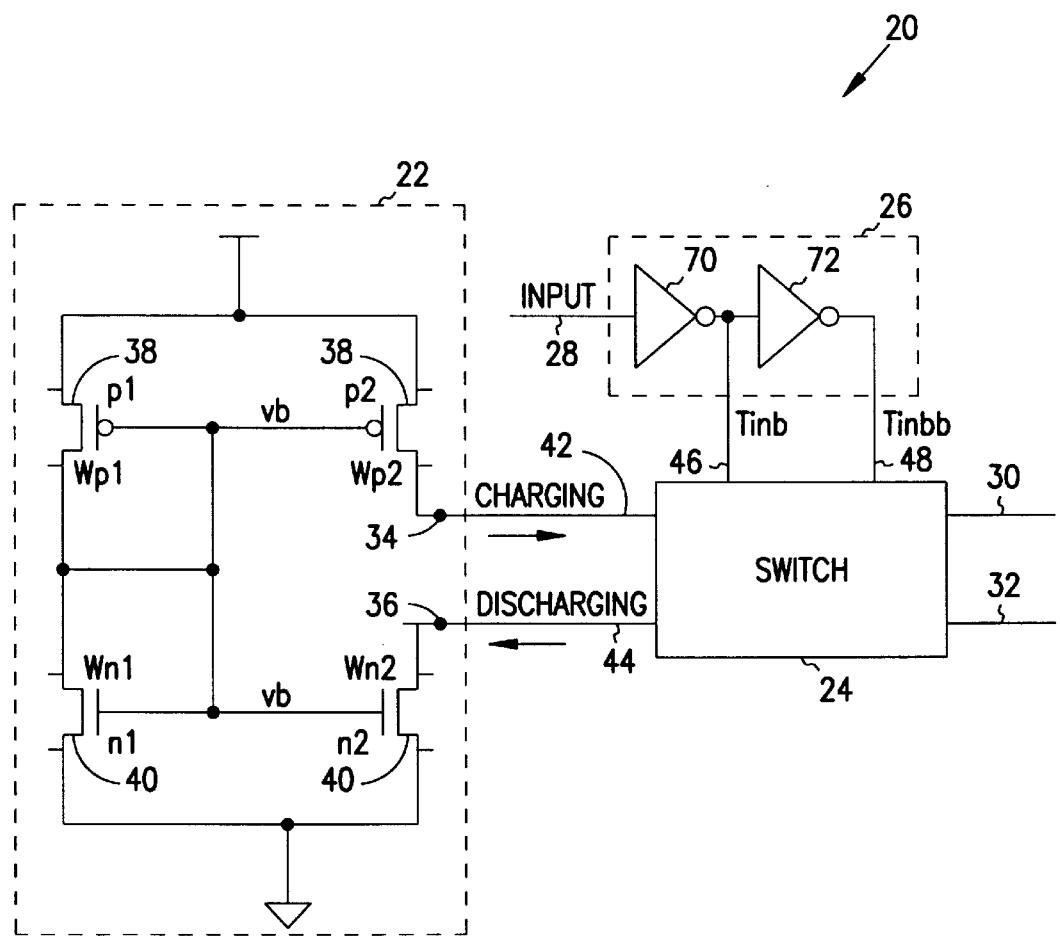
FIG. 2 is a schematic diagram illustrating a two phase clock generation circuit in accordance with one embodiment of the present invention.

FIG. 2 is a schematic diagram illustrating a two phase clock generation circuit 20 in accordance with one embodiment of the present invention. As illustrated, the two phase clock generation circuit 20 includes: a current mirror unit 22, a crossbar switch 24, a selection signal generator 26, an input terminal 28, and first and second output terminals 30, 32. During normal operation, the two phase clock generation circuit 20 receives a single-ended input clock signal at the input terminal 28 and uses the single-ended signal to generate true and complement clock signals at the first and second output terminals 30, 32, respectively. The first and second output terminals 30, 32 are preferably coupled to a balanced output line for delivery of the clock signals to other circuitry. In accordance with the invention, the true and complement clock signals generated by the two phase clock generation circuit 20 will remain aligned to a relatively high degree of accuracy for a wide variety of different process and operating conditions.

The current mirror unit 22 is a balanced current source that generates a charging current and a discharging current. The charging current flows out of the current mirror 22 at a first node 34, referred to herein as the charging node, and the discharging current flows into the current mirror 22 at a second node 36, referred to herein as the discharging node.

The current mirror 22 is designed so that the charging and discharging currents maintain a fixed magnitude ratio during normal operation over a wide range of operating conditions. In addition, the current mirror 22 will maintain the fixed current ratio regardless of process variations that may have occurred during fabrication; including process variations that result in, for example, device channel length variations, device threshold voltage variations, and differing properties between NMOS and PMOS devices. In the illustrated embodiment, the magnitudes of the charging and discharging currents are equal (i.e., the ratio between the currents equals one), although different current magnitudes can also be used in accordance with the invention. The current mirror 22 maintains a fixed current ratio by using a pair of matched p-type metal oxide semiconductor (PMOS) transistors 38 and a pair of matched n-type metal oxide semiconductor (NMOS) transistors 40 in a balanced arrangement with all transistors sharing a common gate voltage, $V_b$. If variations in operating conditions occur during normal operation, the value of $v_b$ automatically adjusts to maintain the proper magnitude ratio between the charging and discharging currents at the output of the current mirror 22. As will be apparent to a person of ordinary skill in the art, other alternative circuit structures can also be used for achieving fixed ratio currents in accordance with the present invention.

The crossbar switch 24 includes a pair of input terminals 42, 44, a pair of output terminals 30, 32, and a pair of selection terminals 46, 48. The output terminals 30, 32 of the crossbar switch 24 serve as the first and second output terminals of the two phase clock generation circuit 20. As illustrated, the first input terminal 42 of the switch 24 is coupled to the charging node 34 of the current mirror 22 and the second input terminal 44 of the switch 24 is coupled to the discharging node 36 of the current mirror 22. The crossbar switch 24 is capable of controllably coupling the individual input terminals 42, 44 to the individual output terminals 30, 32 in response to selection signals applied at the selection terminals 46, 48. Thus, the switch 24 has a first switch configuration where the charging current is coupled to the first output terminal 30 and the discharging current is coupled to the second output terminal 32, resulting in a logic high voltage on the first output terminal 30 and a logic low voltage on the second output terminal 32. The switch 24 also has a second switch configuration where the charging current is coupled to the second output terminal 32 and the discharging current is coupled to the first output terminal 30, resulting in a logic low voltage on the first output terminal 30 and a logic high voltage on the second output terminal 32. By applying appropriate selection signals at the selection terminals 46, 48 of the crossbar switch 24, the switch 24 can be alternated between the first and second switch configurations at a predetermined rate to generate the true and complement clock signals at the first and second output terminals 30, 32, respectively.

Figure 3:
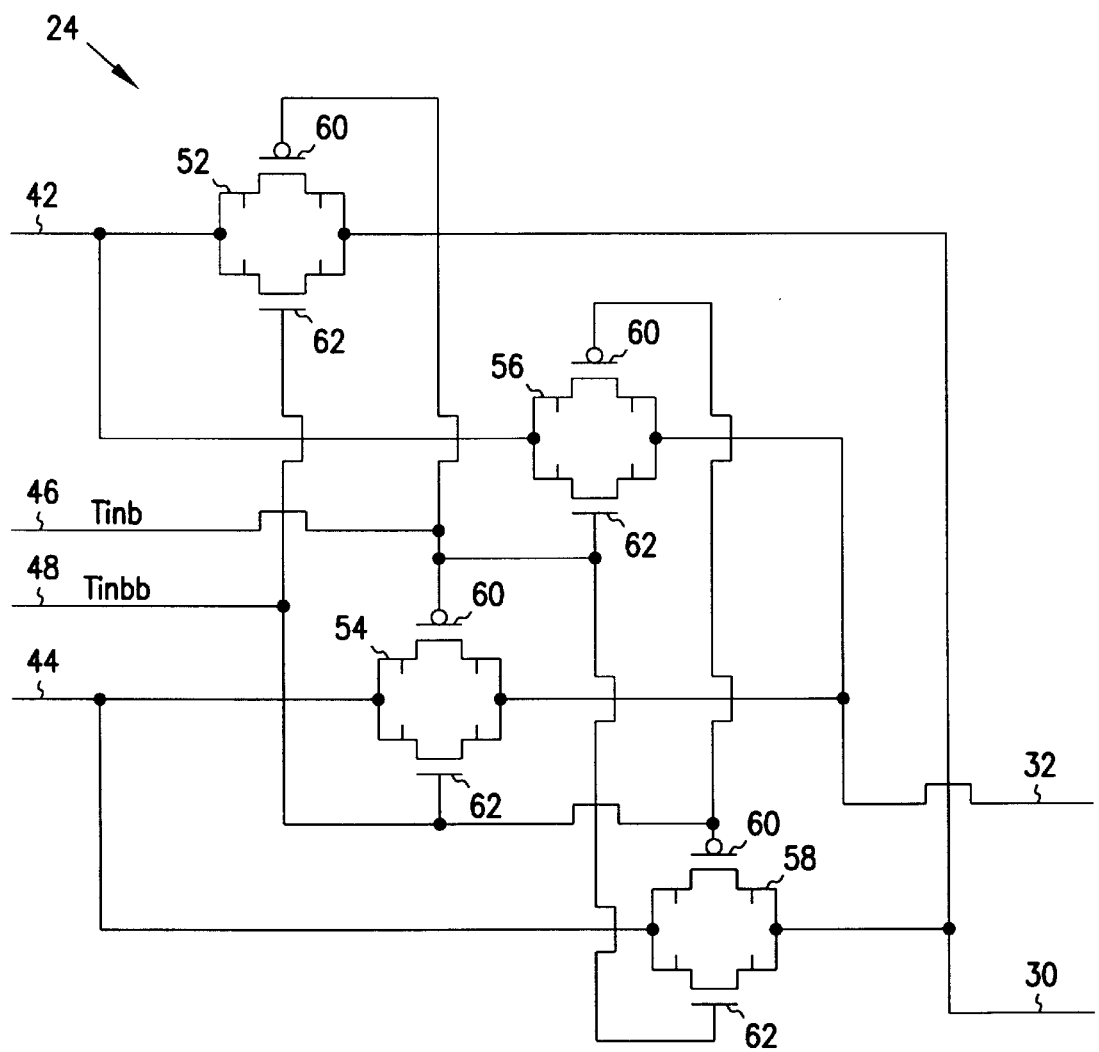
FIG. 3 is a schematic diagram illustrating a crossbar switch architecture that is used in the two phase clock generation circuit of FIG. 2 in one embodiment of the present invention.

FIG. 3 is a schematic diagram illustrating a switch architecture that is used in one embodiment of the present invention to implement the crossbar switch 24 of FIG. 2. As shown, the switch architecture utilizes four CMOS transmission gates 52, 54, 56, 58 that are arranged in a balanced configuration to achieve the desired switching functionality. A first transmission gate 52 is connected between the first input terminal 42 (which is coupled to the charging node 34 of the current mirror 22) and the first output terminal 30. A second transmission gate 54 is connected between the second input terminal 44 (which is coupled to the discharging node 36 of the current mirror 22) and the second output terminal 32. A third transmission gate 56 is connected between the first input terminal 42 and the second output terminal 32 and a fourth transmission gate 58 is connected between the second input terminal 44 and the first output terminal 30.

Each of the transmission gates 52, 54, 56, 58 includes a PMOS transistor 60 and a matched NMOS transistor 62. For the first and second transmission gates 52, 54, the gate of the PMOS transistor 60 is coupled to the first selection terminal 46 and the gate of the NMOS transistor 62 is coupled to the second selection terminal 48. Conversely, for the third and fourth transmission gates 56, 58, the gate of the PMOS transistor 60 is coupled to the second selection terminal 48 and the gate of the NMOS transistor 62 is coupled to the first selection terminal 46. Thus, when the signal level on the first selection terminal 46 is logic low and the signal level on the second selection terminal 48 is logic high, the first and second transmission gates 52, 54 turn "on" and the third and fourth transmission gates 56, 58 turn "off." This couples the charging node 34 to the first output terminal 30 and the discharging node 36 to the second output terminal 32. Similarly, when the signal level on the first selection terminal 46 is logic high and the signal level on the second selection terminal 48 is logic low, the third and fourth transmission gates 56, 58 turn "on" and the first and second transmission gates 52, 54 turn "off." This couples the charging node 34 to the second output terminal 32 and the discharging node 36 to the first output terminal 30. Therefore, by alternately changing the selection signals on the first and second selection terminals 46, 48, the first and second output terminals 30, 32 are alternately charged and discharged in a synchronized fashion. If the charging and discharging currents have equal magnitudes and the first and second output terminals 30, 32 are coupled to a balanced output line, the first and second output terminals 30, 32 will charge and discharge at a substantially equal rate.

Referring back to FIG. 2, the selection signal generator 26 is operative for generating the selection signals that are applied to the crossbar switch 24. In the illustrated embodiment, two selection signals (i.e., tinb and tinbb) are delivered to the switch 24 during normal operation to dynamically configure the switch 24. It should be appreciated that virtually any number of selection signals (including a single signal) can be used to dynamically configure the switch 24 in accordance with the present invention and the actual number of signals used will typically depend upon the architecture of the switch 24 being implemented. In the illustrated embodiment, the selection signal generator 26 includes two inverters 70, 72 connected in series. The input of the first inverter 70 serves as the input terminal 28 of the two phase clock generation circuit 20 and thus receives the single-ended input clock signal. The output of the first inverter 70 is coupled to the first selection terminal 46 of the crossbar switch 24 and the output of the second inverter 72 is coupled to the second selection terminal 48 of the crossbar switch 24. The first inverter 70 inverts the input clock signal to generate an inverted clock signal that acts as the first selection signal tinb of the switch 24. The second inverter 72 inverts the inverted clock signal to generate a twice inverted clock signal that acts as the second selection signal tinbb of the switch 24.

Because of the inversion delay of the second inverter 72, the first and second selection signals, tinb and tinbb, will not be perfect complements of one another. In addition, because of process variations and variations in operating conditions, the offset between the first and second selection signals, tinb and tinbb, may vary over time and/or from circuit to circuit. However, because of the nature of the current mirror 22 and the crossbar switch 24, the offset between the first and second selection signals, even if varying, will not translate to the true and complement clock signals at the first and second output terminals 30, 32 of the two phase clock generation circuit 20. It should be appreciated that many other circuit configurations exist for generating the first and second selection signals (tinb and tinbb) of the crossbar switch 24, as will be apparent to a person of ordinary skill in the art. For example, in one approach, the second inverter 72 is replaced by a delay unit so that the second selection signal (tinbb) is simply a delayed version of the first selection signal (tinb). Other arrangements are also possible.

Figure 4:
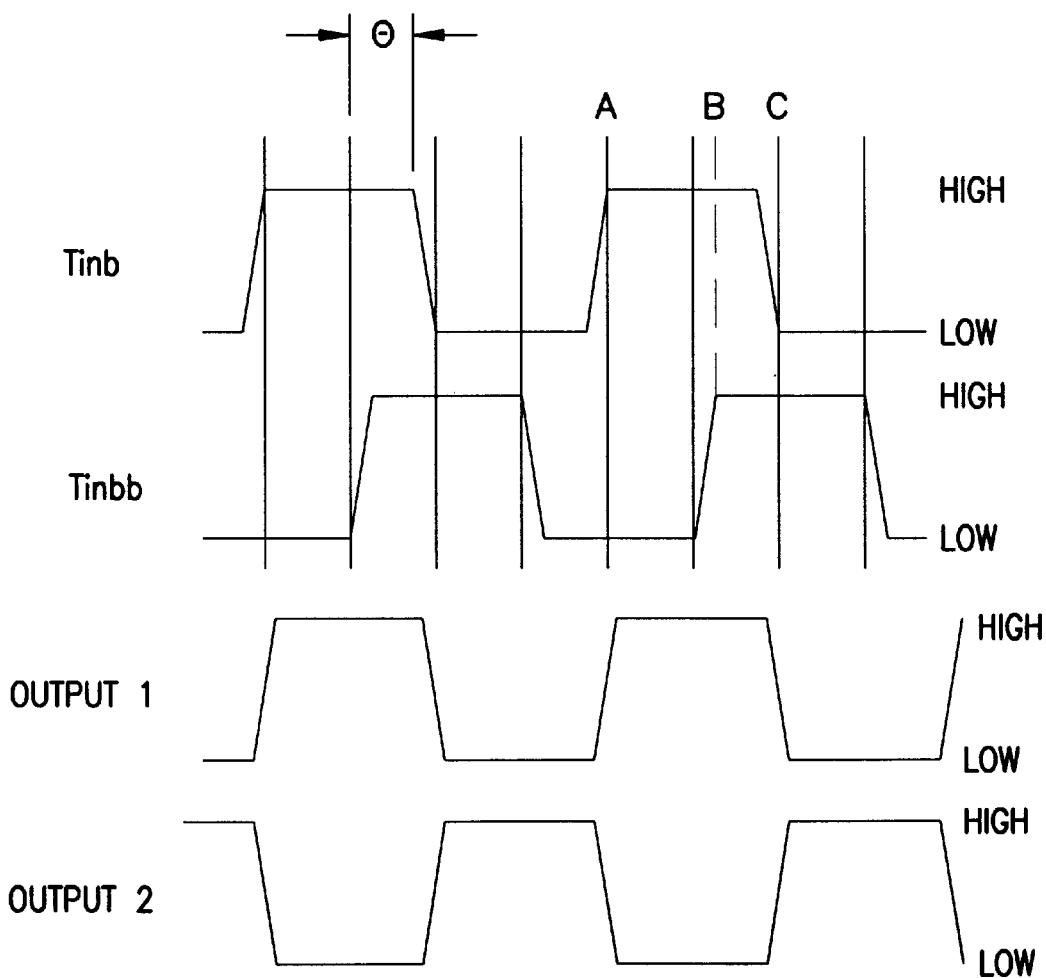
FIG. 4 is a timing diagram illustrating the operation of the two phase clock generation circuit of FIG. 2.

FIG. 4 is a timing diagram illustrating the operation of the two phase clock generation circuit 20 of FIG. 2. As shown, the timing diagram includes four waveforms. The two uppermost waveforms in FIG. 4 correspond to the first and second selection signals (tinb and tinbb) that are delivered to the selection terminals 46, 48 of the switch 24. As discussed above, the first and second selection signals are not precisely complementary. That is, there is an offset θ between the signals. The offset θ between the selection signals has been exaggerated in FIG. 4 to illustrate the fact that the two phase clock generation circuit 20 will still perform its desired function despite a large and/or varying offset between the selection signals. The two lowermost waveforms in the timing diagram of FIG. 4 illustrate the true and complement clock signals (output 1 and output 2) that are output at the first and second output terminals 30, 32 of the two phase clock generation circuit 20, respectively. As described above, when the tinb signal is logic low and the tinbb signal is logic high, the charging node 34 of the current mirror 22 is coupled to the first output terminal 30 and the discharging node 36 of the current mirror 22 is coupled to the second output terminal 32. Thus, the first output terminal 30 charges to the logic high voltage value (e.g., $V_{dd}$) and the second output terminal 32 discharges to the logic low voltage value (e.g., zero). Similarly, when the tinb signal is logic high and the tinbb signal is logic low, the charging node 34 of the current mirror 22 is coupled to the second output terminal 32 and the discharging node 36 of the current mirror 22 is coupled to the first output terminal 30. Thus, the second output terminal 32 charges to the logic high voltage value and the first output terminal 30 discharges to the logic low voltage value. When the selection signals (tinb and tinbb) are both logic high, all of the transmission gates 52, 54, 56, 58 within the crossbar switch 24 are "on" and no change occurs in the output states. This is because the charging current is shunted directly to ground through the discharge node 36 and, therefore, does not charge either output terminal 30, 32. Similarly, the discharging current does not discharge either output terminal 30, 32. When the selection signals (tinb and tinbb) are both logic low, all of the transmission gates 52, 54, 56, 58 within the crossbar switch 24 are "off" and, again, no change occurs in the output states.

As shown in FIG. 4, each time there is a change in at least one of the selection signals tinb and tinbb that results in the signals having different values (e.g., tinb and tinbb are both logic high and then tinb changes to a logic low, etc.), the output clock signals each change there present value. In this manner, the output clock signals each change value at substantially the same time, resulting in little or no timing offset between the signals. For example, at instant a in FIG. 4, tinb has just changed to a logic high and tinbb remains at logic low. As a result, the first output terminal 30 charges to a logic high and the second output terminal 32 discharges to a logic low. At instant b, tinbb has just changed to a logic high. Thus, the two selection signals are now logic high and no output changes occur. At instant c, tinb has just changed to a logic low and the two selection signals again have different values. As a result, the first output terminal 30 discharges to a logic low and the second output terminal 32 charges to a logic high. Thus, even if there is a significant offset between the first and second selection signals (tinb and tinbb), the output clock signals (output 1 and output 2) will align with one another to a high degree of accuracy. In addition, because of the matched and balanced nature of the current mirror 22 and the crossbar switch 24, any process or operating condition variations will effect both output clock signals equally or not at all, with little or no resulting offset. Thus, the two phase clock generation circuit 20 is relatively insensitive to process, voltage, and temperature variations.

It is generally desired that the decay times of the output clock signals be no greater than the difference in time between the selection signals. If the decay times are greater, then the output can decay to a low value, potentially resulting in glitches and other problems down the line. In one embodiment of the invention, a charge keeper is implemented on the output lines for preventing this occurrence.

Figure 5:
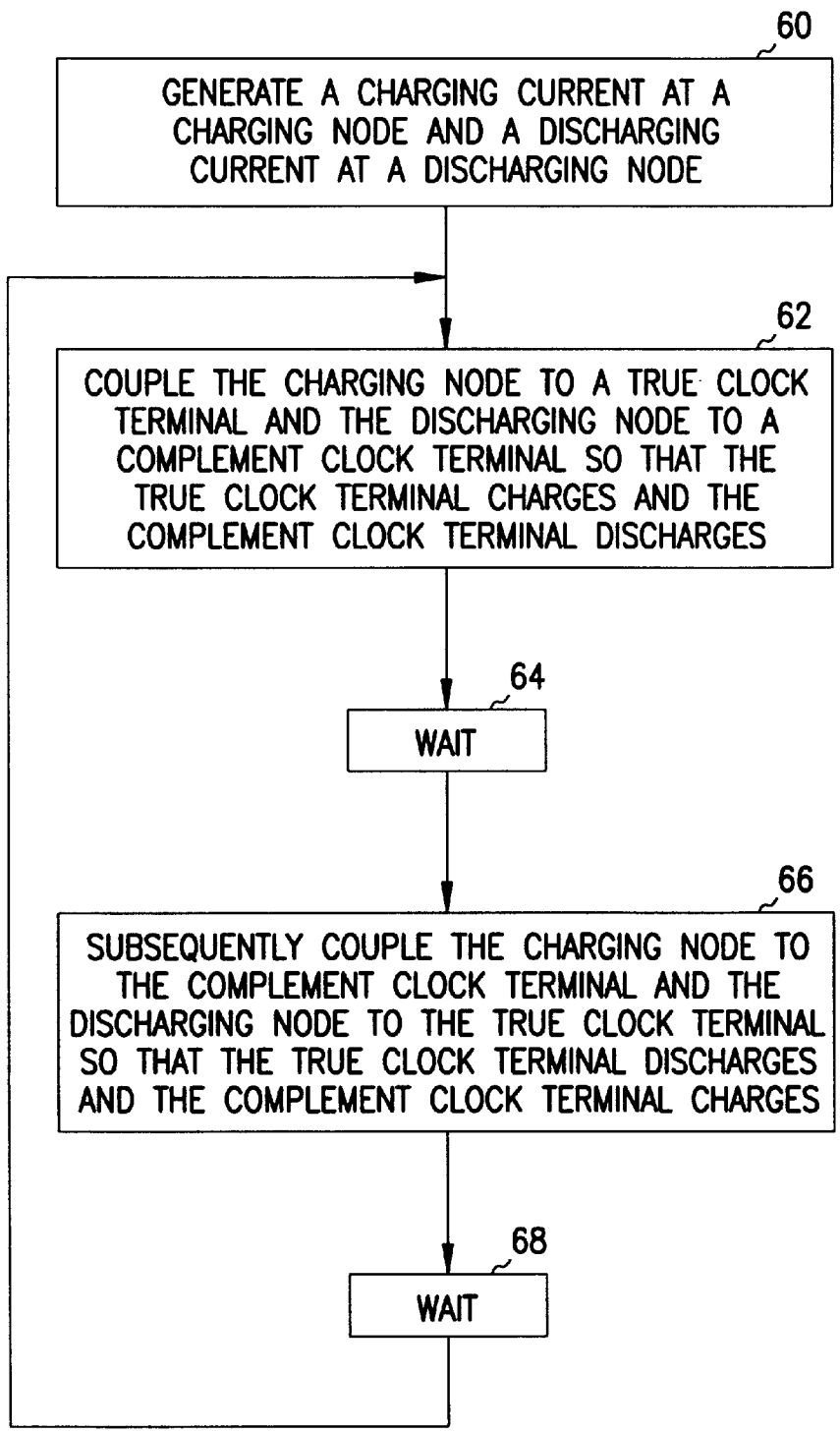
FIG. 5 is a flowchart illustrating a method for generating true and complement clock signals in accordance with one embodiment of the present invention.

FIG. 5 is a flowchart illustrating a method for generating true and complement clock signals in accordance with one embodiment of the present invention. First, a charging current is generated at a charging node and a discharging current is generated at a discharging node (block 60). The charging node is then coupled to a true clock terminal and the discharging node is coupled to a complement clock terminal so that the true clock terminal charges to a logic high value and the complement clock terminal discharges to a logic low value (block 62). After waiting a predetermined time period (block 64), the charging node is coupled to the complement clock terminal and the discharging node is coupled to the true clock terminal so that the true clock terminal discharges to the logic low value and the complement clock terminal charges to the logic high value (block 66). After waiting another predetermined time period (block 68), the above process is repeated. In this manner, the true and complement clock terminals are each alternately charged and discharged by the charging current and the discharging current, respectively, in a synchronized fashion.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A two phase clock generation apparatus, comprising:

a current source to generate a charging current at a first output node and a discharging current at a second output node; and a switch having first and second input terminals and first and second output terminals, said first and second input terminals being coupled to said first and second output nodes of said current source, respectively, said switch having a first switch configuration where said first input terminal is coupled to said first output terminal and said second input terminal is coupled to said second output terminal and a second switch configuration where said first input terminal is coupled to said second output terminal and said second input terminal is coupled to said first output terminal, said switch to alternate between said first and second switch configurations so that said first and second output terminals each alternately charge and discharge in a manner that generates true and complement clock signals on said first and second output terminals.

2. The apparatus claimed in claim 1, wherein:
said current source maintains a fixed ratio between a magnitude of said charging current and a magnitude of said discharging current.

3. The apparatus claimed in claim 1, wherein:
said current source includes a charge mirror circuit.

4. The apparatus claimed in claim 1, wherein:
said switch includes at least one selection terminal to receive one or more selection signals, said switch alternating between said first and second switch configurations based on said one or more selection signals.

5. The apparatus claimed in claim 4, further comprising:
a selection signal generator coupled to said at least one selection terminal to generate said one or more selection signals, said selection signal generator having an input to receive an input clock signal.

6. The apparatus claimed in claim 5, wherein:
said selection signal generator generates two selection signals that are approximately complementary using said input clock signal.

7. The apparatus claimed in claim 1, wherein:
said switch includes a crossbar switch.

8. The apparatus claimed in claim 7, wherein:
said crossbar switch includes at least two CMOS transmission gates arranged in a balanced configuration.

9. A two phase clock generation circuit comprising:
a current mirror circuit to generate a first current having a first polarity and a first magnitude at a first output node and a second current having a second polarity and a second magnitude at a second output node, said second polarity being different from said first polarity and said first and second magnitudes having a fixed ratio;
a switch having first and second input terminals, first and second output terminals, and at least one selection terminal, said first input terminal being connected to said first output node of said current source and said second input terminal being connected to said second output node of said current source, said switch having a plurality of switch states including a first switch state in which said first input terminal is connected to said first output terminal an d said second input terminal is connected to said second output terminal and a second switch state in which said first input terminal is connected to said s econd output terminal and said second input terminal is connected to said first output terminal, wherein a present state of said switch depends upon one or more selection signals on said at least one selection terminal; and
a selection signal generator coupled to said at least one selection terminal of said switch, said selection signal generator to generate said one or more selection signals on said at least one selection terminal to alternate said switch between said first and second switch states at a predetermined switching rate.

10. The two phase clock generation circuit claimed in claim 9, wherein:
said current mirror circuit includes at l east two matched PMOS transistors and at least two matched NMOS transistors arranged in a balanced configuration.

11. The two phase clock generation circuit claimed in claim 10, wherein:
said at least two matched PMOS transistors and said at least two matched NMOS transistors share a common gate voltage.

12. The two phase clock generation circuit claimed in claim 9, wherein:
said switch includes a crossbar switch.

13. The two phase clock generation circuit claimed in claim 12, wherein:
said crossbar switch includes at least two CMOS transmission gates arranged in a balanced configuration.

14. The two phase clock generation circuit claimed in claim 9, wherein:
said selection signal generator includes an input for receiving an input clock signal, wherein said predetermined switching rate is related to a frequency of said input clock signal.

15. The two phase clock generation circuit claimed in claim 9, wherein:
said selection signal generator includes at least one inverter.

16. A method for generating true and complement clock signals, comprising:
generating a charging current at a charging node and a discharging current at a discharging node;
first coupling said charging node to a true clock terminal and said discharging node to a complement clock terminal so that said true clock terminal charges and said complement clock terminal discharges;
second coupling, after said first coupling, said charging node to said complement clock terminal and said discharging node to said true clock terminal so that said true clock terminal discharges and said complement clock terminal charges; and
repeating said first and second coupling at a predetermined switching rate.

17. The method claimed in claim 16, wherein:
said charging current and said discharging current have a fixed magnitude ratio.

18. The method claimed in claim 16, wherein:
said charging current and said discharging current have the same magnitude.

19. The method claimed in claim 16, wherein:
generating includes providing a current mirror circuit.

20. The method claimed in claim 16, comprising:
receiving a single ended clock signal, wherein said predetermined switching rate is related to a fundamental frequency of said single-ended clock signal.

* * * * *

UNITED STATES PATENT AND TRADEMARK OFFICE
CERTIFICATE OF CORRECTION

PATENT NO.    : 6,300,812 B1
DATED         : October 9, 2001
INVENTOR(S)   : Ruhl et al.

It is certified that error appears in the above-identified patent and that said Letters Patent is hereby corrected as shown below:

Column 7,
Line 46, delete "an d" and insert -- and --, therefor.
Line 49, delete "s econd" and insert -- second --, therefor.

Column 8,
Line 3, delete "1 east" and insert -- least --, therefor.

Signed and Sealed this

Ninth Day of July, 2002

Attest:

JAMES E. ROGAN
Attesting Officer          Director of the United States Patent and Trademark Office